United States Patent
Goel et al.

(10) Patent No.: US 8,352,818 B2
(45) Date of Patent: Jan. 8, 2013

(54) METHOD FOR GENERATING TEST PATTERNS FOR SMALL DELAY DEFECTS

(75) Inventors: Sandeep Kumar Goel, Milpitas, CA (US); Narendra B. Devta-Prasanna, Milpitas, CA (US); Ritesh P. Turakhia, Portland, OR (US)

(73) Assignee: LSI Corporation, Milpitas, CA (US)

( * ) Notice: Subject to any disclaimer, the term of this patent is extended or adjusted under 35 U.S.C. 154(b) by 752 days.

(21) Appl. No.: 12/336,472

(22) Filed: Dec. 16, 2008

(65) Prior Publication Data
US 2010/0153795 A1  Jun. 17, 2010

(51) Int. Cl.
*G01R 31/28* (2006.01)
*G06F 11/00* (2006.01)

(52) U.S. Cl. ........ 714/738; 714/726; 714/728; 714/739; 714/741

(58) Field of Classification Search ............ 714/724, 714/726
See application file for complete search history.

(56) References Cited

U.S. PATENT DOCUMENTS

| | | | | |
|---|---|---|---|---|
| 5,886,900 A | * | 3/1999 | Gascoyne et al. | 716/103 |
| 6,449,743 B1 | * | 9/2002 | Hosokawa | 714/738 |
| 6,651,227 B2 | * | 11/2003 | Abadir et al. | 716/108 |
| 6,697,981 B2 | * | 2/2004 | Shigeta | 714/736 |
| 6,707,313 B1 | * | 3/2004 | Rohrbaugh et al. | 324/762.02 |
| 6,836,856 B2 | * | 12/2004 | Blanton | 714/25 |
| 7,137,083 B2 | * | 11/2006 | Hildebrant | 716/112 |
| 8,136,082 B2 | * | 3/2012 | Desineni et al. | 716/136 |
| 2004/0088627 A1 | * | 5/2004 | Nishioka et al. | 714/741 |
| 2007/0288822 A1 | * | 12/2007 | Lin et al. | 714/741 |

OTHER PUBLICATIONS

IWLS 2005 Benchmarks, http://iwls.org/iwls2005/benchmarks.html.
M. Yilmaz, K. Chakrabarty, and M. Tehranipoor, Test-Pattern Grading and Pattern Selection for Small-Delay Defects, IEEE VLSI Test Symposium, 2008, 7 pages.

\* cited by examiner

*Primary Examiner* — Ajay Bhatia
*Assistant Examiner* — Daniel McMahon

(57) ABSTRACT

A method for generating a test pattern set for detecting small delay defects of an IC is disclosed. In one embodiment, the method includes: (1) generating a traditional delay fault pattern, (2) fault grading the traditional delay fault pattern for small delay defect coverage, (3) reporting faults detected by the fault grading and delay information associated with the detected faults, (4) determining which of the detected faults are timing-aware target faults employing the delay information and (5) generating timing-aware delay fault patterns for the timing-aware target faults.

22 Claims, 1 Drawing Sheet

METHOD FOR GENERATING TEST PATTERNS FOR SMALL DELAY DEFECTS

TECHNICAL FIELD

This application is directed, in general, to testing integrated circuits (IC) for manufacturing defects and, more specifically, to testing ICs for small delay defects.

BACKGROUND

Automatic Test Pattern Generation (ATPG) is used to find a test pattern (an input or test sequence) that, when applied to an IC, allows a tester to determine between correct circuit behavior and faulty circuit behavior caused by defects. The generated test patterns can be used to test ICs after manufacture (i.e., manufacturing testing). The effectiveness of ATPG is often measured by the amount of modeled defects (i.e., fault models) that are detected and the number of generated patterns (i.e., pattern count). These metrics can be used to indicate test quality and test run time.

Due to, for example, increased complexity and smaller feature sizes, testing chips (i.e., ICs) for manufacturing defects is becoming increasingly difficult. In addition to the increased transistor count, the use of new technology for the ICs can introduce new defect types which can lead to new types of defect tests. In addition to the conventional stuck and transition fault models, accurate modeling and detection of timing related defects caused by process variation, power supply noise, crosstalk, design-for-manufacturing (DFM) related rule violations (such as single via nets, etc.) is critical to guarantee that manufactured silicon is defect free and does not posses a quality and reliability risk.

As such, testing for small delay defects (SDDS) is becoming a growing concern in the semiconductor industry. SDDs are defects that cause small delays relative to the timing margins allowed by the maximum operating frequency of an IC design. To target SDDs, timing-aware ATPG tests have been developed. In timing-aware pattern generation, timing information is integrated, (e.g., from standard delay format (SDF) files) into the ATPG tool. The integrated timing information is used to guide the ATPG tool to detect faults through the longest paths of the IC in order to improve the ability to detect SDDs. Fault simulation uses the same timing information when grading the tests. Fault simulation, also referred to as fault grading, is performed to estimate fault coverage of the generated test patterns with respect to an IC. When ATPG tools are run in a timing-aware mode, both test pattern generation time as well as test pattern count can be increased significantly (e.g., five to twenty times greater). As such, improved testing for ICs to detect manufacturing defects would be beneficial in the art.

SUMMARY

One aspect provides a method of generating a test pattern set for detecting small delay defects of an IC. In one embodiment, the method includes: (1) generating a traditional delay fault pattern, (2) fault grading the traditional delay fault pattern for small delay defect coverage, (3) reporting faults detected by the fault grading and delay information associated with the detected faults, (4) determining which of the detected faults are timing-aware target faults employing the delay information and (5) generating timing-aware delay fault patterns for the timing-aware target faults.

In yet another embodiment, the method includes: (1) filtering faults detected by fault grading a traditional delay fault pattern for small delay defect coverage to determine which of the detected faults are timing-aware target faults and (2) generating timing-aware delay fault patterns only for the timing-aware target faults.

In still another embodiment, a test pattern generator embodied as a plurality of instructions on a computer-readable storage medium that when the plurality of instructions are executed by a processor cause the processor to create a test pattern set for detecting small delay defects of an integrated circuit. In one embodiment, the test pattern generator includes: (1) a fault filter configured to filter faults detected by fault grading a traditional delay fault pattern for small delay defect coverage to determine which of the detected faults are timing-aware target faults and (2) a fault pattern generator configured to generate timing-aware delay fault patterns only for the timing-aware target faults.

In still yet another embodiment, an apparatus for detecting small delay defects of an integrated circuit is disclosed. In one embodiment, the apparatus includes (1) circuitry for generating a traditional delay fault pattern, (2) circuitry for fault grading the traditional delay fault pattern for small delay defect coverage, (3) circuitry for reporting faults detected by the fault grading and delay information associated with the detected faults, (4) circuitry for determining which of the detected faults are timing-aware target faults employing the delay information and (5) circuitry for generating timing-aware delay fault patterns for the timing-aware target faults.

BRIEF DESCRIPTION

Reference is now made to the following descriptions taken in conjunction with the accompanying drawings, in which.

DETAILED DESCRIPTION

This disclosure provides methods to generate a test pattern set for small delay defects. The disclosed methods can provide a reduced pattern count while achieving similar or higher delay test coverage in less run time compared to conventional default timing-aware ATPG tests. For the cases, where the pattern savings are negligible, the disclosed method can obtain higher delay test coverage resulting in an improved SDD test pattern set compared to the test pattern set generated by the default timing-aware ATPG flow.

SDDs result in timing faults of an IC. Due to the small magnitudes, the SDDs are typically detected along an IC path with minimum slack. Therefore, in the timing aware mode, most ATPG tools try to excite and propagate delay fault effect along the longest path (also the least slack path) for a corresponding fault. Due to the inherent nature of enumerating a number of paths for each fault before actually generating tests, timing-aware ATPG can result in significantly higher run time.

The methods disclosed herein, however, realize that targeting all faults in the timing-aware mode is not required since for a large number of faults (typically >50%), non-timing-aware ATPG does a sufficient job already by either accidentally detecting faults along the longest path or due to only a limited number of possible paths for each fault.

Figure 1:
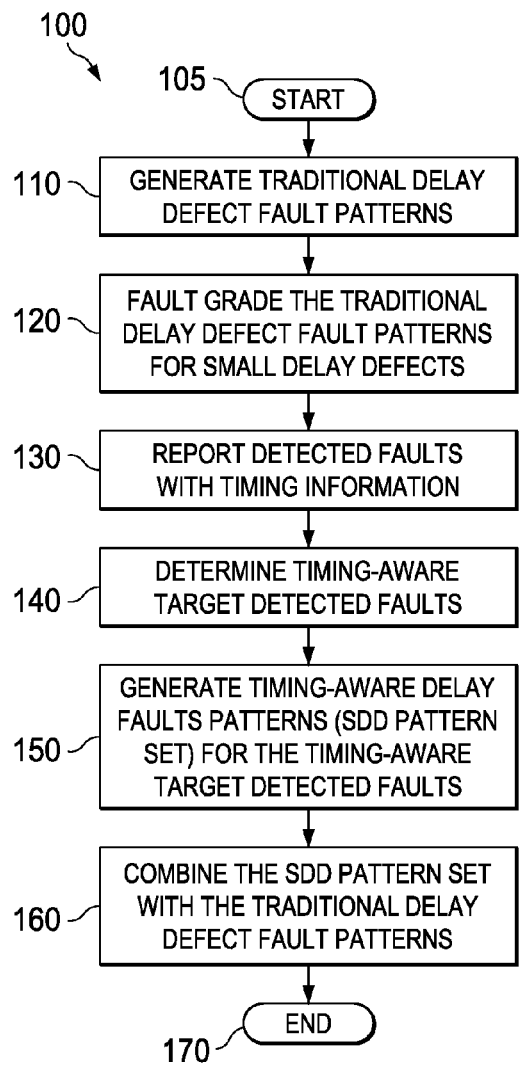
FIG. 1 is a flow diagram of an embodiment of a method for generating a SDD pattern set carried out according to the principles of the present invention.

FIG. 1 illustrates a flow diagram of an embodiment of a method 100 for generating a small-delay defect targeted pattern set carried out according to the principles of the present invention. A test apparatus may include the necessary logic circuitry to carry out the method 100. An ATPG may be employed to carry out at least a portion of the method 100. The method 100 begins in a step 105.

In a step 110, traditional delay defect patterns are generated to test an IC. The traditional delay defect patterns are typically generated to catch gross delay defects for all the faults in a given circuit. The traditional delay defect patterns can be, for example, patterns to detect transition delay faults (TDFs) or in-line resistance faults (IRFs).

Once such a pattern set is generated, the traditional delay defect pattern is fault graded for small delay defect coverage of the IC in a step 120. In fault grading, each fault is simulated independently and differences between simulated faulty device outputs and good device outputs are used for fault detection. The traditional delay defect pattern may be fault graded by simulating the pattern. Simulation of the traditional delay defect pattern for the small delay defects can be performed by setting the ATPG in the timing-aware fault simulation mode. In timing-aware pattern generation, timing information is integrated into the ATPG tool and used to guide the ATPG tool to detect faults through the longest paths of the IC in order to improve the ability to detect SDDs. The timing information may be from SDF files.

In a step 130, all detected faults and the associated timing information (delay information) are reported. The delay information may include the maximum static slack (Ts) and the slack of the path selected by the ATPG (Ta). After reporting the detected faults, the timing-aware target detected faults are determined in a step 140. To determine which of the detected faults are timing-aware targeted detected faults, different filtering criterion can be used. In one embodiment, a detected fault was considered to be a timing-aware targeted detected fault if (Ta−Ts)/Ts>sm, wherein sm is a given slack margin for the IC. Otherwise the detected fault was labeled as non-timing aware faults. Thus, if the slack of the path selected by the ATPG was higher than a particular designated limit, the slack margin sm, then the detected fault was determined to be a timing-aware targeted detected fault.

In other embodiments, different criterions may be used to determine which of the detected faults are timing-aware targeted detected faults. In some embodiments, the fault filtering criterion can be done in an iterative manner such that multiple test patterns are used for fault filtering. For example, "Test Pattern A" can be fault simulated on entire fault list and the resulting faults, "FA" faults, are filtered using a criterion "CA." Now in an iterative manner, the "FA" faults are fault simulated using "Test Pattern B" and the resulting faults are filtered using another criterion "CB." This may be continued until all given patterns are fault simulated. Then the resulting filtered fault list "FX" is used for generating SDD patterns.

After determining the timing-aware targeted detected faults, timing-aware delay fault patterns are generated for the timing-aware targeted detected faults in a step 150. The timing-aware delay fault patterns for the timing-aware targeted detected faults are generated by a timing-aware ATPG run. Performing a timing-aware ATPG run improves the path length for those detected faults determined to be timing-aware targeted detected faults. The longer the path length, the higher the delay test coverage is for the detected fault. Once the timing-aware ATPG is carried out on the filtered timing-aware target fault list, the resulting patterns are shown as an SDD pattern set.

In a step 160, the SDD pattern set is combined with the traditional delay pattern set. The combined pattern sets represent the small-delay defect targeted pattern set. The SDD pattern set can be considered a top-off set of pattern vectors to add to the traditional delay pattern set. The method 100 ends in a step 170.

The method 100 provides a pattern set having higher delay test coverage than traditional delay pattern sets. Since the timing-aware delay fault patterns are generated for the timing-aware targeted detected faults, the pattern count can be less than the timing-aware delay pattern set generated based on the entire fault list.

Figure 2:
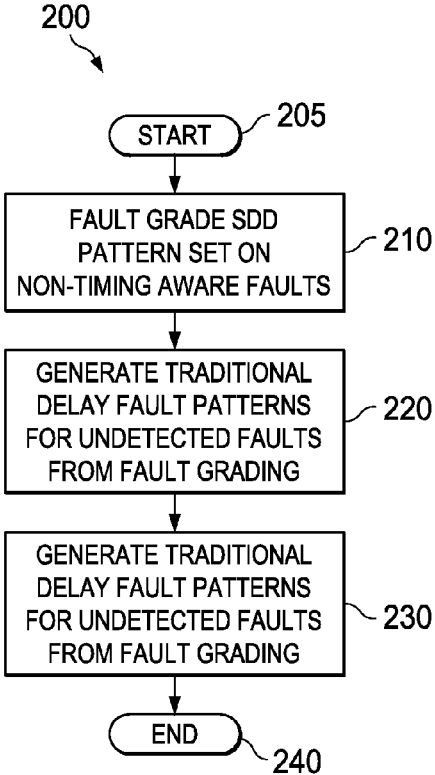
FIG. 2 is a flow diagram of another embodiment of a method for generating an SDD pattern set carried out according to the principles of the present invention.

FIG. 2 is a flow diagram of another embodiment of a method 200 for generating a small-delay defect targeted pattern set carried out according to the principles of the present invention. A test apparatus may include the necessary logic circuitry to carry out the method 200. An ATPG tool may also be employed to carry out the method 200. The method 200 begins in a step 205 with an SDD pattern set that was generated from a filtered timing-aware target fault list such as in step 150 of FIG. 1.

In a step 210, the SDD pattern set is fault graded on non-timing aware faults. The non-timing aware faults can be obtained from a filtering process as performed in step 140 of FIG. 1. Thus, the non-timing aware faults may be faults detected from fault grading of traditional delay fault patterns for small delay defects wherein the slack of the path selected by the ATPG was lower than a particular designated limit, the slack margin sm.

Delay fault patterns are then generated in a step 220 for faults undetected during the fault grading of the non-timing aware target faults. The ATPG may be used to generate these delay fault patterns. The delay fault patterns may be traditional delay fault patterns such as for detecting TDD or IRF.

In a step 230, the delay fault patterns and traditional delay fault patterns are combined to provide an alternative small delay defect targeted pattern set. The traditional delay fault patterns may be generated, for example, by step 110 of the method 100. The size of the alternative small delay defect targeted pattern set is typically smaller than the small delay defect targeted pattern set. Thus, the alternative small delay defect targeted pattern set can provide a further substantial savings, the pattern count. The delay test coverage of the alternative small delay defect targeted pattern set, however, may be lower than the small delay defect targeted pattern set provided by the method 100. After step 230, the method 200 ends in step 240.

Figure 3:
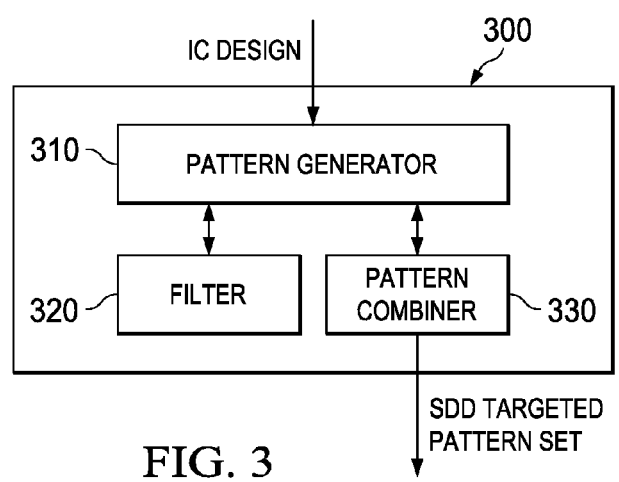
FIG. 3 is a block diagram of an embodiment of a test pattern generating system constructed according to the principles of the present invention.

FIG. 3 is a block diagram of an embodiment of a test pattern generating system 300 constructed according to the principles of the present invention. At least a portion of the test pattern generating system 300 may be embodied as a series of operating instructions, stored in a memory of a computer, that direct the operation of the computer. In one embodiment, the test pattern generating system 300 may be a dedicated device constructed of special purpose hardware. A software program may be used to direct the operation of the dedicated device. The test pattern generating system 300 may be configured to generate a small delay defect targeted pattern set or an alternative small delay defect targeted pattern set as discussed with respect to FIG. 1 and FIG. 2, respectively. The test pattern generating system 300 includes a fault pattern generator 310, a fault filter 320 and a pattern combiner 330.

The fault pattern generator 310 is configured to generate test patterns for determining faults of an integrated circuit.

The fault pattern generator 310 may employ a conventional ATPG to generate the test patterns. The fault pattern generator 310 may generate traditional delay fault patterns, fault grade the traditional delay fault pattern for small delay defect coverage and report faults detected by the fault grading and delay information associated with the detected faults. The fault pattern generator 310 is also configured to generate SDD test patterns. The fault pattern generator 310 can generate the SDD test patterns based on a filtered fault list from the fault filter 320. The fault pattern generator 310 may be configured to generate timing-aware delay fault patterns only for timing-aware target faults as determined by the fault filter 320.

The fault filter 320 is configured to determine which of the detected faults are timing-aware target faults. The fault filter 320 employs the delay information reported by the fault pattern generator 310 to determine the timing-aware target faults. The fault filter 320 may be configured to employ different criteria to determine the timing-aware target faults including the criterions discussed in the method 100. A user may determine which criteria to use for filtering.

The pattern combiner 330 is configured to combine the SDD test patterns with the test patterns, such as traditional delay fault patterns, to provide a small delay defect targeted pattern set. In one embodiment, the pattern combiner 330 is configured to combine delay fault patterns and traditional delay fault patterns to provide an alternative small delay defect targeted pattern set.

The above-described system and methods may be embodied in or performed by various conventional digital data processors or computers, wherein the computers are programmed or store executable programs of sequences of software instructions to perform one or more of the steps of the methods, e.g., steps of the method of FIG. 1 or 2. The software instructions of such programs may be encoded in machine-executable form on conventional digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods, e.g., one or more of the steps of the method of FIG. 1 or 2. Additionally, an apparatus, such as dedicated test equipment, may be designed to include the necessary circuitry to perform each step of the methods of FIG. 1 or 2.

Those skilled in the art to which this application relates will appreciate that other and further additions, deletions, substitutions and modifications may be made to the described embodiments.

What is claimed is:

1. A method of generating a test pattern set for detecting small delay defects of an integrated circuit, comprising:
   generating traditional delay fault patterns;
   fault grading said traditional delay fault patterns for small delay defect coverage;
   reporting faults detected by said fault grading and delay information associated with said detected faults;
   determining which of said detected faults are timing-aware target faults employing said delay information;
   generating timing-aware delay fault patterns for said timing-aware target faults; and
   combining said traditional delay fault patterns and said timing-aware delay patterns to provide a small delay defect targeted pattern set.

2. The method as recited in claim 1 wherein said traditional delay fault patterns are transition delay fault patterns.

3. The method as recited in claim 1 wherein said traditional delay fault patterns are in-line resistive fault patterns.

4. The method as recited in claim 1 wherein said delay information includes maximum static slack.

5. The method as recited in claim 4 wherein said fault grading includes selecting a path of said integrated circuit for applying said traditional delay fault patterns, said delay information including a slack of said selected path.

6. The method as recited in claim 5 wherein said determining a timing-aware target fault includes determining if said slack of said selected path is greater than a designated slack margin.

7. The method as recited in claim 1 further comprising determining which of said detected faults are non-timing aware target faults.

8. The method as recited in claim 7 further comprising fault grading said timing-aware delay fault patterns on said non-timing aware target faults.

9. The method as recited in claim 8 further comprising generating delay fault patterns for faults undetected by said fault grading on said non-timing aware target faults.

10. The method as recited in claim 9 further comprising combining said delay fault patterns and said timing-aware delay fault patterns to provide an alternative small delay defect targeted pattern set.

11. A method of generating a test pattern set for detecting small delay defects of an integrated circuit, comprising:
    filtering faults detected by fault grading traditional delay fault patterns for small delay defect coverage to determine which of said detected faults are timing-aware target faults;
    generating timing-aware delay fault patterns only for said timing-aware target faults; and
    combining said traditional delay fault patterns and said timing-aware delay patterns to provide a small delay defect targeted pattern set.

12. The method as recited in claim 11 wherein said traditional delay fault patterns are transition delay fault patterns.

13. The method as recited in claim 11 wherein said traditional delay fault patterns are in-line resistive fault patterns.

14. The method as recited in claim 11 wherein said filtering includes employing timing information associated with said detected faults to determine which of said detected faults are timing-aware target faults.

15. The method as recited in claim 14 wherein said timing information includes maximum static slack.

16. The method as recited in claim 15 wherein said timing information includes a slack of a path selected for applying said traditional delay fault patterns.

17. The method as recited in claim 16 wherein said filtering includes determining if said slack of said selected path is greater than a designated slack margin.

18. The method as recited in claim 11 wherein said filtering further determines which of said detected faults are non-timing aware target faults.

19. The method as recited in claim 18 further comprising fault grading said timing-aware delay fault patterns on said non-timing aware target faults and generating delay fault patterns for faults undetected by said fault grading on said non-timing aware target faults.

20. The method as recited in claim 19 further comprising combining said delay fault patterns and said timing-aware delay fault patterns to provide an alternative small delay defect targeted pattern set.

21. A test pattern generator embodied as a plurality of instructions on a computer-readable storage medium that when said plurality of instructions are executed by a processor cause said processor to create a test pattern set for detecting small delay defects of an integrated circuit, said test pattern generator comprising:
    a fault filter configured to filter faults detected by fault grading traditional delay fault patterns for small delay defect coverage to determine which of said detected faults are timing-aware target faults;
    a fault pattern generator configured to generate timing-aware delay fault patterns only for said timing-aware target faults; and
    a pattern combiner configured to combine said traditional delay fault patterns and said timing-aware delay fault patterns to provide a small delay defect targeted pattern set.

22. An apparatus for detecting small delay defects of an integrated circuit, comprising:
    circuitry for generating traditional delay fault patterns;
    circuitry for fault grading said traditional delay fault pattern for small delay defect coverage;
    circuitry for reporting faults detected by said fault grading and delay information associated with said detected faults;
    circuitry for determining which of said detected faults are timing-aware target faults employing said delay information;
    circuitry for generating timing-aware delay fault patterns for said timing-aware target faults; and
    circuitry for combining said traditional delay fault patterns and said timing-aware delay patterns to provide a small delay defect targeted pattern set.

\* \* \* \* \*